US012413195B2

(12) United States Patent
Chen et al.

(10) Patent No.: US 12,413,195 B2
(45) Date of Patent: Sep. 9, 2025

(54) GAIN-ADJUSTABLE AMPLIFIER CIRCUIT

(71) Applicant: RichWave Technology Corp., Taipei (TW)

(72) Inventors: Chih-Sheng Chen, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 365 days.

(21) Appl. No.: 18/090,455

(22) Filed: Dec. 28, 2022

(65) Prior Publication Data

US 2023/0163738 A1 May 25, 2023

Related U.S. Application Data

(63) Continuation-in-part of application No. 17/499,831, filed on Oct. 12, 2021, now Pat. No. 12,113,495.
(Continued)

(30) Foreign Application Priority Data

Jul. 29, 2021 (TW) ................................ 110127807

(51) Int. Cl.
*H03F 1/12* (2006.01)
*H03F 3/04* (2006.01)
(Continued)

(52) U.S. Cl.
CPC ................. *H03G 3/30* (2013.01); *H03F 3/04* (2013.01); *H03F 1/12* (2013.01); *H03F 1/56* (2013.01); *H03G 2201/103* (2013.01)

(58) Field of Classification Search
CPC ............... H03G 3/30; H03G 2201/103; H03G 2201/106; H03G 1/0088; H03G 3/001;
(Continued)

(56) References Cited

U.S. PATENT DOCUMENTS 5,157,323 A * 10/1992 Ali ....................... H03H 11/245 333/81 R
5,913,154 A * 6/1999 Wynn ....................... H03F 3/24 455/235.1
(Continued)

FOREIGN PATENT DOCUMENTS

CN 102158187 A 8/2011
CN 107612516 A 1/2018
(Continued)

OTHER PUBLICATIONS

Office action mailed on Jan. 19, 2024 for the U.S. Appl. No. 17/499,831, filed Oct. 12, 2021, p. 1-17 ,Jan. 19, 2024.

*Primary Examiner* — Andrea Lindgren Baltzell
*Assistant Examiner* — Khiem D Nguyen
(74) *Attorney, Agent, or Firm* — Winston Hsu

(57) ABSTRACT

An amplifier circuit includes an amplifier for generating an amplified input signal according to an input signal, and an attenuator circuit coupled to the amplifier. The attenuator circuit includes an input terminal for receiving the input signal or the amplified input signal, an output terminal, a reference voltage terminal, a zeroth resistor-switch circuit, a first resistor-switch circuit, and a second resistor-switch circuit. The zeroth resistor-switch circuit includes a first terminal coupled to the input terminal, a second terminal coupled to the output terminal, a zeroth switch coupled to the first terminal of the zeroth resistor-switch circuit and the second terminal of the zeroth resistor-switch circuit, a zeroth resistor coupled between the first terminal of the zeroth resistor-switch circuit and the second terminal of the zeroth resistor-switch circuit, a first resistor coupled between the zeroth resistor and the second terminal of the zeroth resistor-switch circuit, and a first switch.

20 Claims, 9 Drawing Sheets

3
20
40
Sin
Amplifier
Sin'
Attenuator circuit
Sat1
Sout
11
12
50
Attenuator circuit
Sat2

Related U.S. Application Data

(60) Provisional application No. 63/294,857, filed on Dec. 30, 2021.

(51) Int. Cl.
*H03G 3/30* (2006.01)
*H03F 1/56* (2006.01)

(58) Field of Classification Search
CPC ...... H03F 3/04; H03F 1/56; H03F 2203/7233; H03F 1/12; H03F 1/223; H03F 3/193; H03F 3/72
USPC .................................................. 330/278, 284
See application file for complete search history.

(56) References Cited

U.S. PATENT DOCUMENTS

| | | | | |
|---|---|---|---|---|
| 7,948,317 | B2 | 5/2011 | Wan | |
| 10,530,320 | B2 * | 1/2020 | Sharma | H03H 7/06 |
| 2003/0058041 | A1 | 3/2003 | Koizumi | |
| 2018/0138868 | A1 | 5/2018 | Darwish | |

FOREIGN PATENT DOCUMENTS

| | | |
|---|---|---|
| JP | 4936151 | 5/2012 |
| TW | 449962 | 8/2001 |

* cited by examiner

403
RS0
RS1
RS2
OUT
IN
REF
CS60
SW60
CS61
SW631
R631
RA631
R611
RA611
SW611
R621
RA621
SW621

GAIN-ADJUSTABLE AMPLIFIER CIRCUIT

CROSS REFERENCE TO RELATED APPLICATION

This application claims the benefit of U.S. Provisional Application No. 63/294,857, filed on Dec. 30, 2021. Further, this application is a continuation-in-part of U.S. application Ser. No. 17/499,831, filed on Oct. 12, 2021. The contents of these applications are incorporated herein by reference.

TECHNICAL FIELD

The present invention is related to an amplifier circuit, and more particularly to a gain-adjustable amplifier circuit.

BACKGROUND

With increasing popularity of the Internet and mobile devices, users demand more for communication quality. However, the gain range of the traditional single-stage amplifier is limited. The traditional structure cannot meet the current practical application and design requirements. Therefore, it is an important issue to provide a gain-adjustable amplifier circuit.

SUMMARY

An embodiment provides an amplifier circuit including an amplifier for generating an amplified input signal according to an input signal, and an attenuator circuit coupled to the amplifier. The attenuator circuit includes an input terminal for receiving the input signal or the amplified input signal, an output terminal, a reference voltage terminal, a zeroth resistor-switch circuit, a first resistor-switch circuit, and a second resistor-switch circuit. The zeroth resistor-switch circuit includes a first terminal coupled to one of the input terminal and the output terminal, a second terminal coupled to another one of the input terminal and the output terminal, a zeroth switch coupled to the first terminal of the zeroth resistor-switch circuit and the second terminal of the zeroth resistor-switch circuit, a zeroth resistor coupled between the first terminal of the zeroth resistor-switch circuit and the second terminal of the zeroth resistor-switch circuit, a first resistor coupled between the zeroth resistor and the second terminal of the zeroth resistor-switch circuit, and a first switch. The first switch includes a first terminal coupled to the zeroth resistor and the first resistor, a second terminal coupled to the second terminal of the zeroth resistor-switch circuit, and a control terminal. The first resistor-switch circuit includes a first terminal coupled to one of the input terminal and the reference voltage terminal, a second terminal coupled to another one of the input terminal and the reference voltage terminal, a zeroth resistor coupled between the first terminal of the first resistor-switch circuit and the second terminal of the first resistor-switch circuit, a first resistor coupled between the zeroth resistor and the second terminal of the first resistor-switch circuit, and a first switch. The first switch includes a first terminal coupled to the zeroth resistor and the first resistor, a second terminal coupled to the second terminal of the first resistor-switch circuit, and a control terminal. The second resistor-switch circuit includes a first terminal coupled to one of the output terminal and the reference voltage terminal, a second terminal coupled to another one of the output terminal and the reference voltage terminal, a zeroth resistor coupled between the first terminal of the second resistor-switch circuit and the second terminal of the second resistor-switch circuit, a first resistor coupled between the zeroth resistor and the second terminal of the second resistor-switch circuit, and a first switch. The first switch includes a first terminal coupled to the zeroth resistor and the first resistor, a second terminal coupled to the second terminal of the second resistor-switch circuit, and a control terminal.

DETAILED DESCRIPTION

Figure 1:
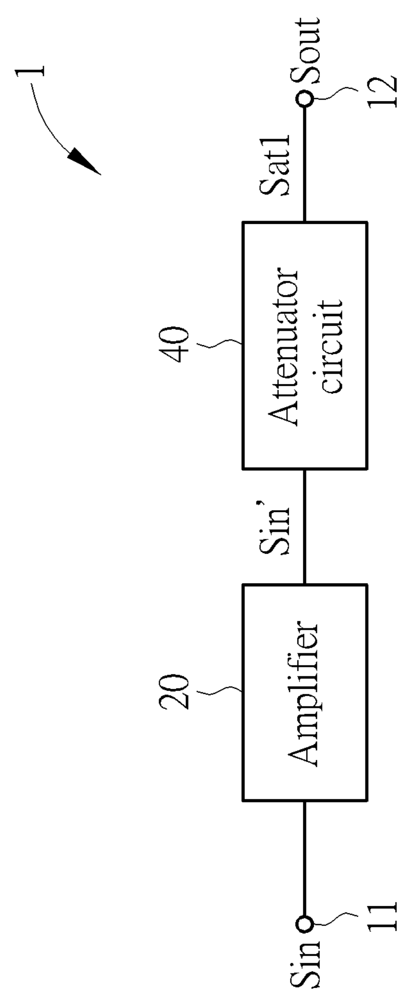
FIG. 1 is a block diagram of a gain-adjustable amplifier circuit of a first embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please refer to FIG. 1. FIG. 1 is a block diagram of a gain-adjustable amplifier circuit of an embodiment of the present invention. The gain-adjustable amplifier circuit 1 includes an input terminal 11, an output terminal 12, amplifier 20 and an attenuator circuit 40.

The input terminal 11 is for receiving an input signal Sin, and the output terminal 12 is for sending an output signal Sout. The output signal Sout can be sent to the backend circuit for further process. The input signal Sin and the output signal Sout are, for example, but not limited to, radio frequency signals.

An input terminal of the amplifier 20 can receive the input signal Sin through the input terminal 11 and can amplify the input signal Sin according to its gain, so as to output the amplified input signal Sin' at an output terminal of the amplifier 20. The amplifier 20 includes a low-noise amplifier or a power amplifier.

An input terminal of the attenuator circuit 40 may be coupled to the output terminal of the amplifier 20. The output terminal may be coupled to the output terminal 12. The attenuator circuit 40 can provide a plurality of attenuations to the amplified input signal Sin', and to generate the attenuated signal Sat1 accordingly. For example, the attenuator circuit 40 can select one of a plurality of attenuations according to the gain required by the amplifier circuit 1 to attenuate the amplitude of the amplified input signal Sin' to a specific value, thereby generating the attenuated signal Sat1. The output signal Sout can be generated by the attenuated signal Sat1. In this way, the gain of the amplifier circuit 1 can be related to the attenuation of the amplified input signal Sin'. That is, the gain required by the amplifier circuit 1 can be realized based on the attenuation of the amplified input signal Sin'. The gain of the amplifier circuit 1 may be 0 dB or greater than 0 dB. It should be noted that since the attenuator circuit 40 can provide a plurality of attenuations to the amplified input signal Sin', the gain of the amplifier circuit 1 is not limited by the gain range of the amplifier 20. Through the attenuator circuit 40 the gain range of the amplifier circuit 1 can be expended and the gain of the amplifier circuit 1 can be adjusted. Not only that, since the attenuator circuit 40 is coupled to the output of the amplifier 20, the attenuator circuit 40 would not easily generate loading effect at the input of the amplifier 20. Thus it is hard to affect the performance of the amplifier circuit 1, so the linearity and noise figure of the amplifier circuit 1 are maintained.

Figure 2:
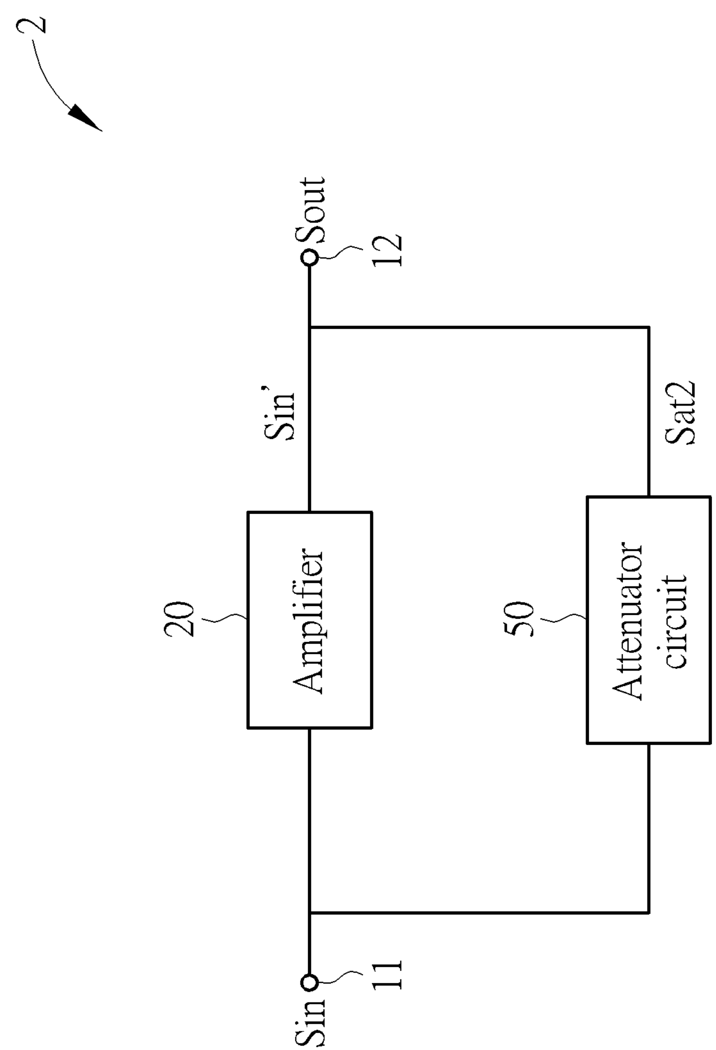
FIG. 2 is a block diagram of a gain-adjustable amplifier circuit of a second embodiment of the present invention.

Please refer to FIG. 2. FIG. 2 is a block diagram of a gain-adjustable amplifier circuit of a second embodiment of the present invention. The major difference between the embodiment of FIG. 2 and the embodiment of FIG. 1 is that the gain-adjustable amplifier circuit 2 of FIG. 2 includes an amplifier 20 and an attenuator circuit 50.

The input terminal of the attenuator circuit 50 may be coupled to the input terminal 11, and the output terminal may be coupled to the output terminal 12. The attenuator circuit 50 can be configured to provide a plurality of attenuations to the input signal Sin, and generate the attenuated signal Sat2 accordingly. For example, the attenuator circuit 50 can select one of the attenuations according to the gain required by the amplifier circuit 2 to attenuate the amplitude of the input signal Sin to a specific value, thereby generating the attenuated signal Sat2.

Furthermore, the amplifier circuit 2 can operate in either amplifying mode or bypass mode. When the intensity of the input signal Sin is not strong enough and needed to be amplified by the amplifier 20, the amplifier 20 can be enabled. The amplifier circuit 2 can operate in an amplifying mode with the first gain. Further, the input signal Sin can be inputted from the input terminal 11 to the amplifier 20. The amplifier 20 can amplify the input signal Sin according to its gain and output the amplified input signal Sin' at its output terminal. The output signal Sout can be generated by the amplified input signal Sin'. Therefore, the first gain is related to the gain of the amplifier 20. When the intensity of the input signal Sin is high enough that it does not need to be amplified by the amplifier 20, the amplifier 20 can be disabled. The amplifier circuit 2 can operate in the bypass mode with the second gain (equal or less than 0 dB). It should be noted that the disabled amplifier 20 can reduce unnecessary current consumption. Further, the input signal Sin is input to the attenuator circuit 50 from the input terminal 11 and the attenuator circuit 50 can attenuate the input signal Sin according to the selected attenuation to generate the attenuated signal Sat2. The output signal Sout can be generated by the attenuated signal Sat2. In this way, the second gain can be related to the attenuation of the input signal Sin. That is, the second gain required by the amplifier circuit 2 can be achieved based on the attenuation of the input signal Sin. The second gain may be less than the first gain. The first gain may be greater than 0 dB, and the second gain may be equal or less than 0 dB. It should be noted that since the attenuator circuit 50 can provide a plurality of attenuations to the input signal Sin, the gain range of the amplifier circuit 2 can be expanded and the gain of the amplifier circuit 2 can be adjusted through the attenuator circuit 50.

Figure 3:
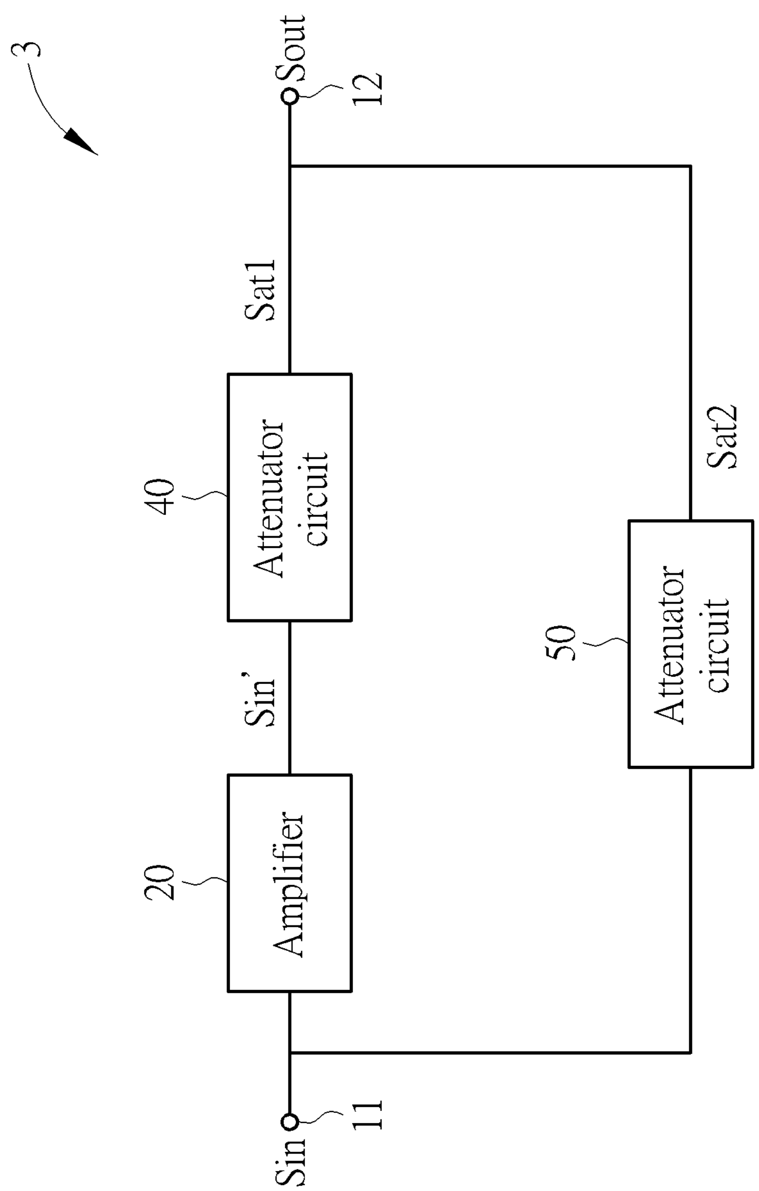
FIG. 3 is a block diagram of a gain-adjustable amplifier circuit of a third embodiment of the present invention.

Please refer to FIG. 3. FIG. 3 is a block diagram of a gain-adjustable amplifier circuit of a third embodiment of the present invention. The major difference between the embodiment of FIG. 3 and the embodiment of FIG. 2 is that the gain-adjustable amplifier circuit 3 of FIG. 3 may further include an attenuator circuit 40. The input terminal of the attenuator circuit 40 may be coupled to the output terminal of the amplifier 20, and the output terminal of the amplifier 20 may be coupled to the output terminal 12. The attenuator circuits 40 and 50 can respectively provide a plurality of attenuations to the amplified input signal Sin' and respectively generate attenuated signals Sat1 and Sat2 accordingly.

Comparing to the amplifier circuit 2 of the second embodiment, when the amplifier circuit 3 operates in amplifying mode, the attenuator circuit 40 can attenuate the amplified input signal Sin' according to the selected attenuation to generate the attenuator signal Sat1. The output signal Sout can be generated by the attenuator signal Sat1. In this way, the first gain can be related to the attenuation of the amplified input signal Sin'. That is, in this embodiment, the first gain required by the amplifier circuit 3 can be realized based on the attenuation of the amplified input signal Sin', and the second gain required by the amplifier circuit 3 can be realized based on the attenuation of the input signal Sin. Since the amplified input signal Sin' is generated after the input signal Sin passing through the amplifier 20, the first gain may be greater than the second gain. The first gain may be equal or greater than 0 dB, and the second gain may be equal or less than 0 dB.

Figure 4:
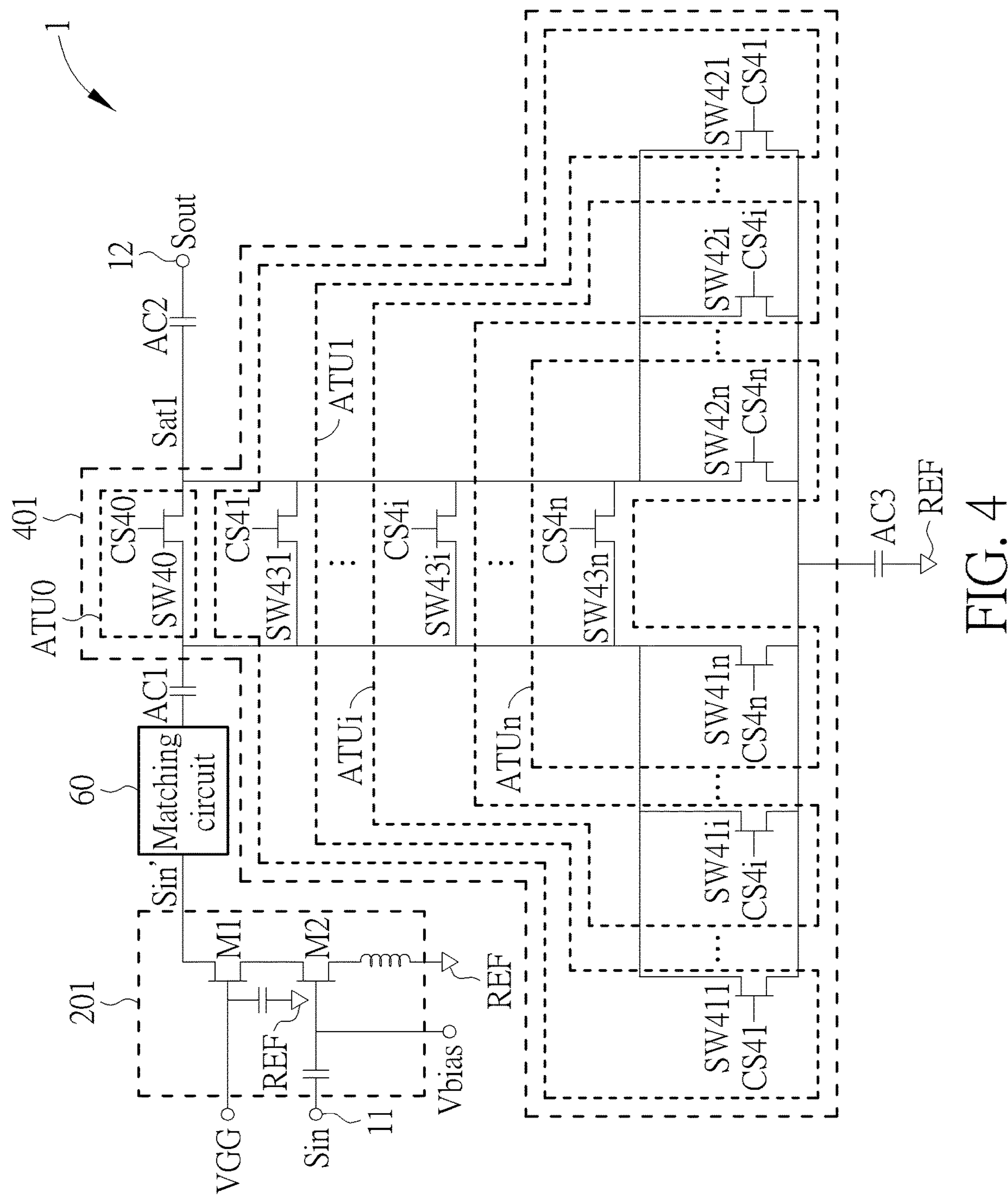
FIG. 4 is a circuit diagram of the gain-adjustable amplifier circuit 1 of FIG. 1.

Please refer to FIG. 4. FIG. 4 is a circuit diagram of the gain-adjustable amplifier circuit 1 of FIG. 1. The amplifier 201 and the attenuator circuit 401 of FIG. 4 may correspond respectively to the amplifier 20 and the attenuator circuit 40 of FIG. 1.

As shown in FIG. 4, amplifier 201 can include transistors M1 and M2. The first terminal of the transistor M1 is coupled to the output terminal of the amplifier 201, and the control terminal is for receiving the operation signal VGG. The operation signal VGG is for enabling or disabling the amplifier 201. The first terminal of the transistor M2 is coupled to the second terminal of the transistor M1. The second terminal is coupled to the reference potential terminal 13, and the control terminal is coupled to the input terminal of the amplifier 201 and can further receive the bias signal Vbias. The bias signal Vbias can bias the transistor M2. The reference voltage terminal REF may be, but is not limited to, a ground terminal in the system.

The attenuator circuit 401 can include a plurality of attenuator units ATU0-ATUn, each attenuator unit ATU0-ATUn is coupled between the input terminal and the output terminal of the attenuator circuit 401, and each attenuator unit ATU0-ATUn can respectively provide one of the plurality of attenuations. For example, the attenuator unit ATU0 can provide attenuation of 0 dB; the attenuator unit ATU1 can provide attenuation of 5 dB; the attenuator unit ATUi can provide attenuation of 10 dB and the attenuator unit ATUn can provide attenuation of 20 dB. In other words, attenuator units ATU0-ATUn can provide different attenuations. It should be noted that when one of the attenuator units (e.g., the attenuator unit ATU0) is enabled, the rest of the attenuator units (e.g., the attenuator units ATU1-ATUn) are disabled.

One of the attenuator units (e.g., the attenuator unit ATU0) can include a switch SW40, and a control terminal of the switch SW40 can receive the control signal CS40. The control signal CS40 can turn on or off the switch SW40, thereby enabling or disabling the attenuator unit ATU0 (e.g., turning on the switch SW40 can enable the attenuator unit ATU0, thereby providing attenuation of 0 dB).

The remaining attenuator units (e.g., the attenuator units ATU1-ATUn) of the plurality of attenuator units ATU0-ATUn may each include a π-type attenuator. Further, the π-type attenuator in the attenuator unit ATU1 can include switches SW411, SW421 and SW431. The control terminals of the switches SW411, SW421 and SW431 can receive the control signal CS41. The control signal CS41 can turn on or off the switches SW411, SW421 and SW431, thereby enabling or disabling the attenuator unit ATU1. For example, turning on the switches SW411, SW421 and SW431 can enable the attenuator unit ATU1 to provide attenuation of 5 dB. Then π-type attenuator in the attenuator unit ATUi can include switches SW41*i*, SW42*i* and SW43*i*. The control terminals of the switches SW41*i*, SW42*i* and SW43*i* can receive the control signal CS4*i*. The control signal CS4*i* can turn on or off the switches SW41*i*, SW42*i* and SW43*i*, thereby enabling or disabling the attenuator unit ATUi. The π-type attenuator in the attenuator unit ATUn can include switches SW41*n*, SW42*n* and SW43*n*. The control terminals of switches SW41*n*, SW42*n* and SW43*n* can receive the control signal CS4*n*. The control signal CS4*n* can turn on or off the switches SW41*n*, SW42*n* and SW43*n*, thereby enabling or disabling the attenuator unit ATUn, and so on. It should be noted that "i" and "n" are positive integers. The control signals CS40-CS4*n* can be provided by an internal circuit of the attenuator circuit 401 or an external circuit outside of the attenuator circuit 401. It should be noted that although the number of attenuator units shown in FIG. 4 is more than two, the actual number of attenuator units may be determined according to the actual application or design requirements. Hence, the invention is not limited to the number of attenuator units shown in FIG. 4.

In addition, the first terminal of the switch SW40 is coupled to the input terminal of the attenuator circuit 401, and the second terminal is coupled to the output terminal of the attenuator circuit 401. The first terminal of each switch SW411-SW41*n* is coupled to the input terminal of the attenuator circuit 401, and the second terminal is coupled to reference voltage terminal REF. The first terminal of each switch SW421-SW42*n* is coupled to the output terminal of the attenuator circuit 401, and the second terminal of each switch SW421-SW42*n* is coupled to the reference voltage terminal REF. The first terminal of each switch SW431-SW43*n* is coupled to the input terminal of the attenuator circuit 401, and the second terminal of each switch SW431-SW43*n* is coupled to the output terminal of the attenuator circuit 401. In other embodiments, the attenuator circuit 40 shown in FIG. 3 may also include the attenuator circuit 401 shown in FIG. 4.

The attenuation corresponding to each attenuator unit ATU1-ATUn may be related to its resistance. For example, the on-resistance of the switches SW411, SW421 and SW431 can be chosen based on the attenuation corresponding to the attenuator unit ATU1. The on-resistance of the switches SW41*i*, SW42*i* and SW43*i* can be chosen based on the attenuation corresponding to the attenuator unit ATUi. The on-resistance of the switches SW41*n*, SW42*n* and SW43*n* can be chosen based on the attenuation corresponding to the attenuator unit ATUn, and so on. That is, the switches SW411-SW43*n* not only can switch the corresponding attenuator units ATU1-ATUn, but also can provide the corresponding attenuations. In other embodiments, the on-resistance of the switches SW411 and SW421 can be substantially the same; the on-resistance of the switches SW41*i* and SW42*i* can be substantially the same; the on-resistance of the switches SW41*n* and SW42*n* can be substantially the same, and so on. In another example, the attenuator units ATU1, ATUi and ATUn can provide 5 dB, 10 dB and 20 dB of attenuations respectively, and the on-resistance of the switch SW431 can be less than the on-resistance of the switch SW43*i*; the on-resistance of the switch SW43*i* may be less than the on-resistance of the switch SW43*n*. In this embodiment, by properly choosing the channel width-to-length ratio of the switches SW411-SW43*n*, the switches SW411-SW43*n* can have appropriate on-resistance. In this way, when one of the attenuator units ATU1-ATUn is enabled, the appropriate corresponding attenuation can be provided.

The amplifier circuit 1 may further include a matching circuit 60, and capacitors AC1, AC2 and AC3. The matching circuit 60 is coupled between the output terminal of the amplifier 201 and the input terminal of the attenuator circuit 401, and is for providing an output impedance matching to the amplifier 201. It can include resistors, inductors, capacitors or any combination of the foregoing three elements. Since the attenuator circuit 401 is substantially symmetrical, the difference between the impedance at the input terminal and the impedance at the output terminal of the attenuator circuit 401 can be within a predetermined range. Thus, the attenuator circuit 401 would not significantly impact the output impedance matching of the amplifier 201. The capacitor AC1 is coupled between the matching circuit 60 and the attenuator circuit 401. The capacitor AC2 is coupled between the attenuator circuit 401 and the output terminal 12. The capacitor AC3 is coupled between the attenuator circuit 401 and the reference voltage terminal REF. The capacitor AC1 can block the DC bias voltage from the amplifier 201, and the capacitors AC2 and AC3 can block the DC bias voltage from the attenuator circuit 401. In other embodiments, the amplifier circuit 1 may selectively include capacitor AC1, AC2 or AC3 according to practical applications or design requirements.

Figure 5:
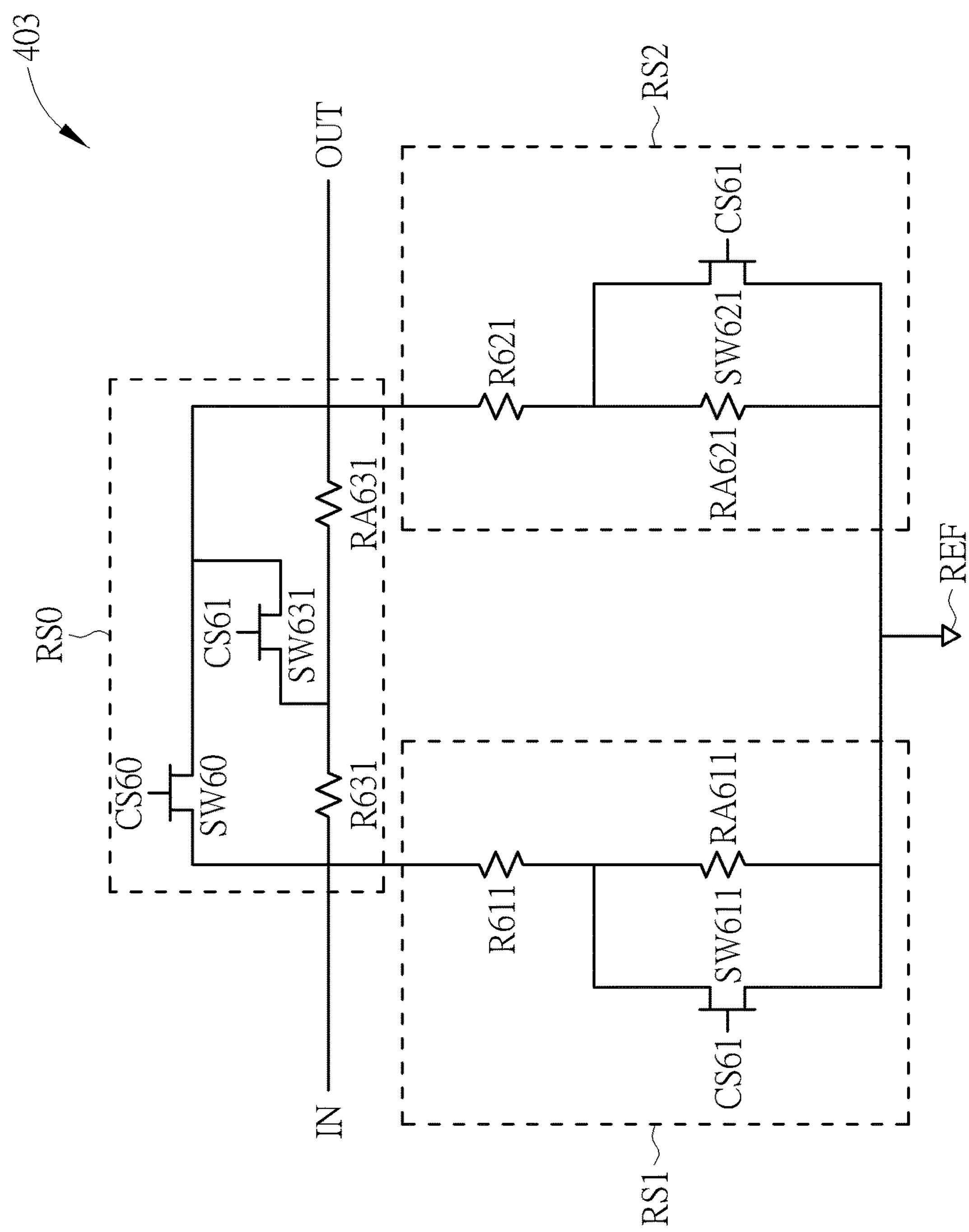
FIG. 5 is a circuit diagram of the attenuator circuit in the gain-adjustable amplifier circuit of FIG. 1, 2 or 3.

Please refer to FIG. 5. FIG. 5 is a circuit diagram of the attenuator circuit in the gain-adjustable amplifier circuit 1, 2 or 5 of the embodiment of the present invention. The attenuator circuit 403 of FIG. 5 may correspond to the attenuator circuit 40 of FIG. 1 or FIG. 3, or the attenuator circuit 50 of FIG. 2 or FIG. 3.

The attenuator circuit 403 includes an input terminal IN for receiving the input signal or the amplified input signal, an output terminal OUT, a reference voltage terminal REF, resistor-switch circuits RS0, RS1, and RS2. The resistor-switch circuit RS0 includes a first terminal coupled to one of the input terminal IN and the output terminal OUT, a second terminal coupled to the other one of the input terminal IN and the output terminal OUT, switches SW60 and SW631, and resistors R631 and RA631. The resistor-switch circuit RS1 includes a first terminal coupled to one of the input terminal IN and the reference voltage terminal REF, a second terminal coupled to the other one of the input terminal IN and the reference voltage terminal REF, resistors R611 and RA611, and a switch SW611. The resistor-switch circuit RS2 includes a first terminal coupled to one of the output terminal OUT and the reference voltage terminal REF, a second terminal coupled to the other one of the output terminal OUT and the reference voltage terminal REF, resistors R621 and RA621 and a switch SW621.

The first terminal of the switch SW60 is coupled to the input terminal IN of the attenuator circuit 403. The second terminal of the switch SW60 is coupled to the output terminal OUT of the attenuator circuit 403. The control terminal of the switch SW60 is for receiving the control signal CS60. The control signal CS60 can turn on or turnoff the switch SW60. The first terminal of the resistor R611 is coupled to the input terminal IN of the attenuator circuit 403. The second terminal of the resistor R611 is coupled to the first terminal of the switch SW611. The second terminal of the switch SW611 is coupled to the reference voltage terminal REF. The control terminal of the switch SW611 is for receiving the control signal CS61. The first terminal of the resistor RA611 is coupled to the second terminal of the resistor R611 and the first terminal of the switch SW611. The second terminal of the resistor RA611 is coupled to the second terminal of the switch SW611. The first terminal of the resistor R621 is coupled to the output terminal OUT of the attenuator circuit 403. The second terminal of the resistor R621 is coupled to the first terminal of the switch SW621. The second terminal of the switch SW621 is coupled to the reference voltage terminal REF, and the control terminal of the switch SW621 is for receiving the control signal CS61. The first terminal of the resistor RA621 is coupled to the second terminal of the resistor R621 and the first terminal of the switch SW621. The second terminal of the switch SW621 is coupled to the second terminal of the switch SW621. The first terminal of the resistor R631 is coupled to the input terminal IN of the attenuator circuit 403, and the second terminal of the resistor R631 is coupled to the first terminal of the switch SW631. The second terminal of the switch SW631 is coupled to the output terminal OUT of the attenuator circuit 403. The control terminal of the switch SW631 is for receiving the control signal CS61. The first terminal of the resistor RA631 is coupled to the second terminal of the resistor R631 and the first terminal of the switch SW631. The second terminal of the resistor RA631 is coupled to the second terminal of the switch SW631. The control signal CS61 can turn on and turn off the switches SW611-SW631. The control signals CS60 and CS61 can be provided by an internal circuit in the attenuator circuit 403 or an external circuit outside of the attenuator circuit 403.

For example, by turning on the switch SW60 and turning off the switches SW611-SW631, the attenuator circuit 403 can provide the first attenuation. Alternatively, turning off the switch SW60 and turning on the switches SW611-SW631 can form the first π-type attenuator. The first π-type attenuator equivalently includes resistors R611-R631 and switches SW611-SW631, and the attenuator circuit 403 can provide the second attenuation. Alternatively, the switches SW60, SW611-SW631 can be turned off to form the second π-type attenuator. The second π-type attenuator equivalently includes resistors R611-R631 and RA611-RA631, and the attenuator circuit 403 can provide the third attenuation. The third attenuation may be greater than the second attenuation, and the second attenuation may be greater than the first attenuation. That is, resistors R611, R621 and R631 are shared in the first and second π-type attenuators, so occupied areas of the attenuator circuit are reduced.

Further, the on-resistance of the switch SW60 can be chosen based on the first attenuation. The on-resistance of the switches SW611-SW631 and/or the resistance of the resistors R611-R631 can be chosen based on the second attenuation. The resistance of the resistors RA611-RA631 are chosen based on the third attenuation and the resistance of the resistors R611 to R631. That is, the switches SW611-SW631 can operate to switch the attenuator circuit 403 between the first π-type attenuator and the second π-type attenuator to provide corresponding attenuations. In other embodiments, the overall equivalent resistance of the switch SW611 and the resistor R611 and the overall equivalent resistance of the switch SW621 and the resistor R621 can be substantially the same. In another example, the first attenuation, the second attenuation and the third attenuation can be 0 dB, 5 dB and 6 dB respectively, and the resistance of the switch SW60 can be less than the overall equivalent resistance of the switch SW631 and the resistor R631; the overall equivalent resistance of switch SW631 and the resistor R631 can be less than the overall equivalent resistance of the resistors R631 and RA631. In this embodiment, the switches SW60, SW611-SW631 can have appropriate on-resistance by carefully choosing the channel width-to-length ratio of the switches SW60 and SW611-SW631.

Please refer back to FIG. 4. When the control signals CS40-CS4$n$ turn off the switches SW40-SW43$n$ respectively, the attenuator circuit 401 is disabled. At this time, the output terminal of the amplifier 201 and the output terminal 12 of the amplifier circuit 1 are electrically disconnected. In other words, the output terminal 12 of the amplifier circuit 1 would not output the output signal Sout because the amplifier circuit 1 is now a zero gain amplifier. However, in the case where the attenuator circuit 401 being replaced by the attenuator circuit 403, when the control signals CS60-CS61 turn off the switches SW60-SW631, the attenuator circuit 403 can forma π-type attenuator. That is, the attenuator circuit 403 is still enabled, and the output terminal of the amplifier 201 and the output terminal 12 of the amplifier circuit 1 can be electrically connected through the attenuator circuit 403. In other words, the output signal Sout can be generated from the attenuator signal Sat1, and the output terminal 12 of the amplifier circuit 1 can still output the output signal Sout. In this way, the gain of the amplifier circuit 1 is associated with the attenuation of the amplified input signal Sin'.

It should be noted that since the attenuator circuit 403 has a plurality of different π-type attenuators (e.g., the first π-type attenuator and the second π-type attenuator), it can be regarded as having a substantially symmetrical circuit structures. In each of the circuit structure, the difference between the impedance at the input terminal IN and the impedance at the output terminal OUT of the attenuator circuit 403 can be within a predetermined range. The predetermined range may be ±10%. In other embodiments, the impedance at the input terminal IN of the attenuator circuit 403 and the impedance at the output terminal OUT of the attenuator circuit 403 may be substantially equal. Substantially equal means conjugate matching between the impedance at the input terminal IN and the impedance at the output terminal OUT of the attenuator circuit 403. That is, the impedance at the input terminal IN and the impedance at the output terminal OUT of the attenuator circuit 403 are complex conjugate of each other.

Further, the impedance at the input terminal IN of the attenuator circuit 403 can be the equivalent impedance looking from the input terminal IN into the internal of the attenuator circuit 403. The impedance at the output terminal OUT of the attenuator circuit 403 can be the equivalent impedance looking from the internal towards the output terminal OUT of the attenuator circuit 403. In addition, the difference between the equivalent impedance looking from the matching circuit 60 into the attenuator circuit 403 and the equivalent impedance looking from the attenuator circuit 403 towards the output terminal 12 of the amplifier circuit 1 can also be within a predetermined range.

The relationship between the various attenuations and the switches SW60 and SW611-SW631 described in the above paragraphs is summarized in Table 1.

TABLE 1

| | SW60 | SW611-SW631 |
|---|---|---|
| First attenuation | ON | OFF |
| Second attenuation | OFF | ON |
| Third attenuation | OFF | OFF |

Third attenuation > Second attenuation > First attenuation

Figure 6:
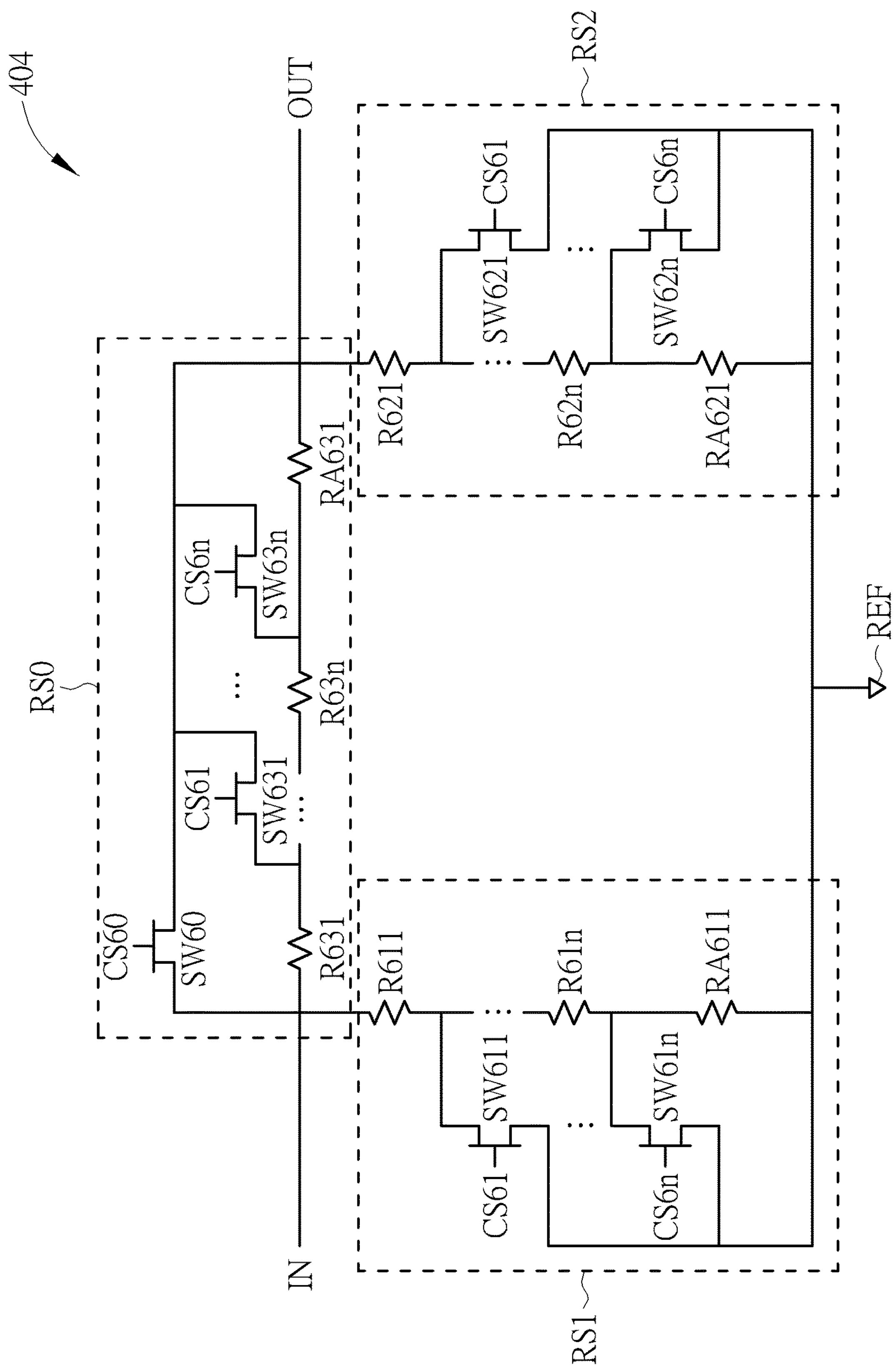
FIG. 6 is another circuit diagram of the attenuator circuit in the gain-adjustable amplifier circuit of FIG. 1, 2 or 3.

Please refer to FIG. 6. FIG. 6 is another circuit diagram of the attenuator circuit in the gain-adjustable amplifier circuit 1, 2 or 3 of the embodiment of the present invention. The attenuator circuit 404 of FIG. 6 may correspond to the attenuator circuit 40 of FIG. 1 or FIG. 3, or the attenuator circuit 50 of FIG. 2 or FIG. 3.

The major difference between the attenuator circuit 404 of FIG. 6 and the attenuator circuit 403 is that the resistor-switch circuits RS1, RS2, and RS0 of the attenuator circuit 404 further include at least resistors R61*n*, R62*n* and R63*n* respectively, and switches SW61*n*, SW62*n* and SW63*n* respectively. In the above symbols, "n" may be a positive integer greater than 1. As shown in FIG. 6, the first terminal of the resistor R61*n* is coupled to the second terminal of the resistor R61 (n−1) and the first terminal of the switch SW61 (n−1). The second terminal of the resistor R61*n* is coupled to the first terminal of the switch SW61*n* and the first terminal of the resistor RA611. The second terminal of the switch SW61*n* is coupled to the reference voltage terminal REF. The control terminal of the switch SW61*n* is for receiving the control signal CS6*n*. The first terminal of the resistor R62*n* is coupled to the second terminal of the resistor R62 (n−1) and the first terminal of the switch SW62 (*n*−1). The second terminal of the resistor R62*n* is coupled to the first terminal of the switch SW62*n* and the first terminal of the resistor RA621. The second terminal of the switch SW62*n* is coupled to the reference voltage terminal REF. The control terminal of the switch SW62*n* is for receiving the control signal CS6*n*. The first terminal of the resistor R63*n* is coupled to the second terminal of the resistor R63 (n−1) and the first terminal of the switch SW63 (*n*−1). The second terminal of the resistor R63*n* is coupled to the first terminal of the switch SW63*n* and the first terminal of the resistor RA631. The second terminal of the switch SW63*n* is coupled to the output terminal OUT of the attenuator circuit 404. The control terminal of the switch SW63*n* is for receiving the control signal CS6*n*. The control signal CS6*n* can turn on or turn off the switches SW61*n*-SW63*n*. The control signals CS60, CS61 to CS6*n* may be provided by an internal circuit of the attenuator circuit 404 or by an external circuit outside of the attenuator circuit 404.

Taking n=2 as an example, when turning on the switch SW60 and turning off the switches SW611-SW63*n*, the attenuator circuit 404 can provide the first attenuation. Alternatively, when turning off the switches SW60, SW61*n*-SW63*n*, and turning on the switches SW611-SW631, the attenuator circuit 404 can form a first π-type attenuator. The first π-type attenuator includes the resistors R611-R631, the switches SW611-SW631. In this configuration, the attenuator circuit 404 can provide second attenuation. Alternatively, when turning off the switches SW60, SW611-SW631, and turning on the switches SW61*n*-SW63*n*, the attenuator circuit 404 can form a second π-type attenuator. The second π-type attenuator includes the resistors R61*n*-R63*n*, the switches SW61*n*-SW63*n*. In this configuration, the attenuator circuit 404 can provide third attenuation. Alternatively, turning off the switches SW60, SW611-SW63*n* can form a third π-type attenuator. The third π-type attenuator includes resistors RA611-RA631. In this configuration, the attenuator circuit 404 can provide the fourth attenuation. The fourth attenuation may be greater than the third attenuation; the third attenuation may be greater than the second attenuation, and the second attenuation may be greater than the first attenuation.

Further, the on-resistance of the switch SW60 can be chosen based on the first attenuation. The on-resistance of the switches SW611-SW631 and/or the resistance of the resistors R611-R631 can be chosen based on the second attenuation. The on-resistance of the switches SW61*n*-SW63*n* and/or the resistance of the resistors R61*n*-R63*n* can be chosen based on the third attenuation and the resistance of the resistors R611-R631. The resistance of the resistors RA611-RA631 can be chosen based on the fourth attenuation and the resistance of the resistors R611-R63*n*, and so on. That is, the switches SW611-SW63*n* not only can switch between the first π-type attenuator, the second π-type attenuator and the third π-type attenuator, but also can provide the corresponding attenuation. In other embodiments, the overall equivalent resistance of the switch SW611 and the resistor R611 can be the same as the overall equivalent resistance of the switch SW621 and the resistor R621. For example, the first attenuation, the second attenuation, the third attenuation and the fourth attenuation can be 0 dB, 5 dB, 10 dB and 11 dB respectively. The overall equivalent resistance of the switch SW60 can be less than the overall equivalent resistance of the switch SW631 and the resistor R631, the overall equivalent resistance of the switch SW631 and the resistor R631 can be less than the overall equivalent resistance of the switch SW63*n* and the resistors R63*n* and R631, and the overall equivalent resistance of the switch SW63*n* and the resistors R63*n* and R631 can be less than the overall equivalent resistance of the resistors R631, R63*n* and RA631, and so on. In this embodiment, the channel width-to-length ratios of the switches SW60, SW611-SW63*n* can be chosen so that the switches SW60, SW611-SW63*n* have appropriate on-resistance.

It should be noted that since the attenuator circuit 404 can form a plurality of different π-type attenuators, which can be regarded as having substantially symmetrical circuit structures. In each of the circuit structures, the difference between the impedance at the input terminal IN of the attenuator circuit 404 and the impedance at the output terminal OUT of the attenuator circuit 404 is within a predetermined range. The predetermined range may be ±10%. In other embodiments, the impedance at the input terminal IN of the attenuator circuit 404 and the impedance at the output terminal OUT of the attenuator circuit 404 may be substantially equal. Substantially equal means conjugate matching between the impedance at the input terminal IN of the attenuator circuit 404 and the impedance at the output terminal OUT of the attenuator circuit 404. That is, the impedance at the output terminal OUT of the attenuator circuit 404 and the impedance at the input terminal IN of the attenuator circuit 404 are complex conjugate of each other.

Further, the impedance at the input terminal IN of the attenuator circuit 404 can be the equivalent impedance looking from the input terminal IN into the internal of the attenuator circuit 404. The impedance at the output terminal OUT of the attenuator circuit 404 can be the equivalent impedance looking from the internal towards the output terminal OUT of the attenuator circuit 404. In addition, the difference between the equivalent impedance looking from the matching circuit 60 into the attenuator circuit 404 and the equivalent impedance looking from the attenuator circuit 404 towards the output terminal 12 of the amplifier circuit 1 can also be within a predetermined range.

When n=2, the relationship between the various attenuations and the switches SW60, SW611-SW631 and SW61*n*-SW63*n* described in the above paragraphs is summarized in Table 2.

TABLE 2

| | SW60 | SW611-SW631 | SW61n-SW63n |
|---|---|---|---|
| First attenuation | ON | OFF | OFF |
| Second attenuation | OFF | ON | OFF |
| Third attenuation | OFF | OFF | ON |
| Fourth attenuation | OFF | OFF | OFF |

Fourth attenuation > Third attenuation > Second attenuation > First attenuation

Please note that the integer "n" can be greater than 2. As such, there can be as many chain coupled switches SW61*n*-SW63*n* and resistors R61*n*-R63*n* in the attenuator circuit 404 as possible. This configuration allows the attenuator circuit 404 to provide more choice of attenuations for flexible implementation.

Figure 7:
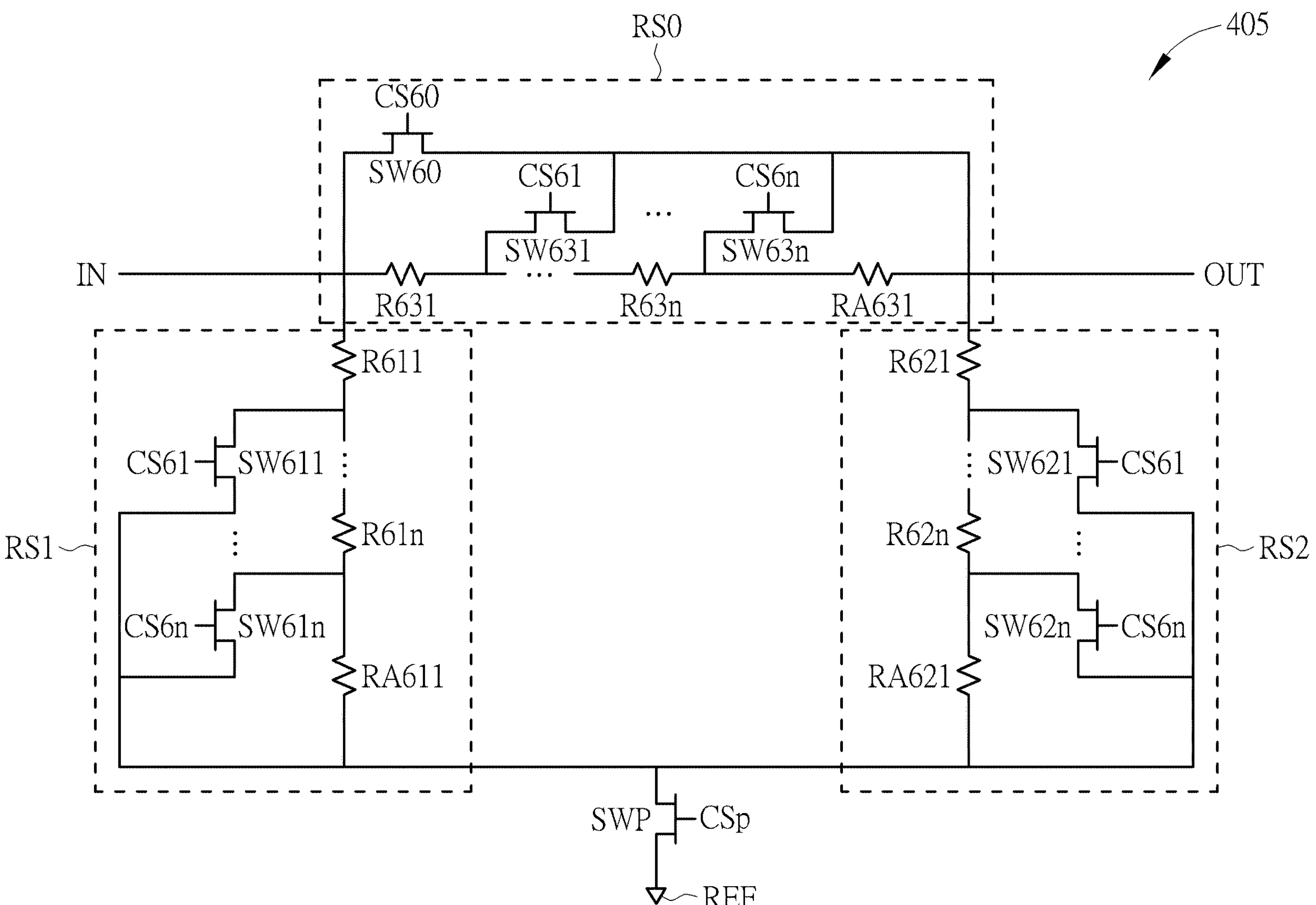
FIG. 7 is another circuit diagram of the attenuator circuit in the gain-adjustable amplifier circuit of FIG. 1, 2 or 3.

Please refer to FIG. 7. FIG. 7 is another circuit diagram of the attenuator circuit 40 of the gain-adjustable amplifier circuit 1, 2 or 3 of the embodiment of the present invention. The attenuator circuit 405 of FIG. 7 may correspond to the attenuator circuit 40 of FIG. 1 or FIG. 3 or attenuator circuit 50 of FIG. 2 or FIG. 3.

The major difference between the attenuator circuit 404 and the attenuator circuit 405 is that the attenuator circuit 405 may further include a switch SWP. The switch SWP may be coupled to between the second terminal of the resistor-switch circuits RS1 and/or RS2, and the reference voltage terminal REF. The control terminal can receive a control signal CSp. The control signal CSp can turn on or turn off the switch SWP.

Taking n=2 as an example, when turning on the switch SW60 and turning off the switches SW611-SW63*n* and the switch SWP, the attenuator circuit 405 can provide the first attenuation. Alternatively, when turning off the switches SW60, SW61*n*-SW63*n*, and turning on the switches SW611-SW631 and the switch SWP, the attenuator circuit 405 can form a first π-type attenuator. The first π-type attenuator includes the resistors R611-R631, the switches SW611-SW631 and the switch SWP. In this configuration, the attenuator circuit 405 can provide second attenuation. Alternatively, when turning off the switches SW60, SW611-SW631, and turning on the switches SW61*n*-SW63*n* and the switch SWP, the attenuator circuit 405 can form a second π-type attenuator. The second π-type attenuator includes the resistors R611-R63*n*, the switches SW61*n*-SW63*n* and the switch SWP. In this configuration, the attenuator circuit 405 can provide third attenuation. Alternatively, when turning off the switches SW60 and SW611-SW63*n* and turning on the switch SWP, the attenuator circuit 405 can form a third π-type attenuator. The third π-type attenuator includes the resistors R611-R631 and RA611-RA631 and the switch SWP. In this configuration, the attenuator circuit 405 can provide the fourth attenuation. The fourth attenuation may be greater than the third attenuation; the third attenuation may be greater than the second attenuation, and the second attenuation may be greater than the first attenuation.

When the attenuator circuit 405 provides the first attenuation, the switches SW611-SW61*n*, SW621-SW62*n*, and SWP are equivalent to capacitors with their respective off-capacitance. The equivalent circuit can be regarded as the capacitors with the off-capacitance of the switches SW611-SW61*n* and the switches SW621-SW61*n* coupled connected in series with the capacitor with the off-capacitance of the switch SWP. Therefore, the switch SWP can reduce the overall capacitance of the attenuator circuit 405, thereby avoiding load effect. When the attenuator circuit 405 provides the second attenuation, the third attenuation or the fourth attenuation, the turned-on switch SWP is equivalent to a resistor. The switch SWP can provide flexibility to the resistance of the first π-type attenuator, the second π-type attenuator or the third π-type attenuator. Further, the on-resistance of the switches SW611-SW631 and SWP and/or the resistance of the resistors R611-R631 can be chosen based on the second attenuation. The resistance of the resistors R611-R631 can be chosen based on the third attenuation. The on-resistance of the switch SWP can be chosen based on the on-resistance of the switches SW61*n*-SW63*n* and/or the resistance of the resistors R61*n*-R63*n*. The resistance of the resistors R611-R63*n*, the on-resistance of the switch SWP and the resistance of the resistors RA611-RA631 can be chosen based on the fourth attenuation and so on.

When n=2, the relationship between the various attenuations and the switches SW60, SW611-SW631, SW61*n*-SW63*n*, and SWP described in the above paragraphs is summarized in Table 3.

TABLE 3

| | SW60 | SW611-SW631 | SW61n-SW63n | SWP |
|---|---|---|---|---|
| First attenuation | ON | OFF | OFF | OFF |
| Second attenuation | OFF | ON | OFF | ON |
| Third attenuation | OFF | OFF | ON | ON |
| Fourth attenuation | OFF | OFF | OFF | ON |

Fourth attenuation > Third attenuation > Second attenuation > First attenuation

Please note that the integer "n" can be greater than 2. As such, there can be as many chain coupled switches SW61*n*-SW63*n* and resistors R61*n*-R63*n* in the attenuator circuit 405 as possible. This configuration allows the attenuator circuit 405 to provide more choice of attenuations for flexible implementation.

Figure 8:
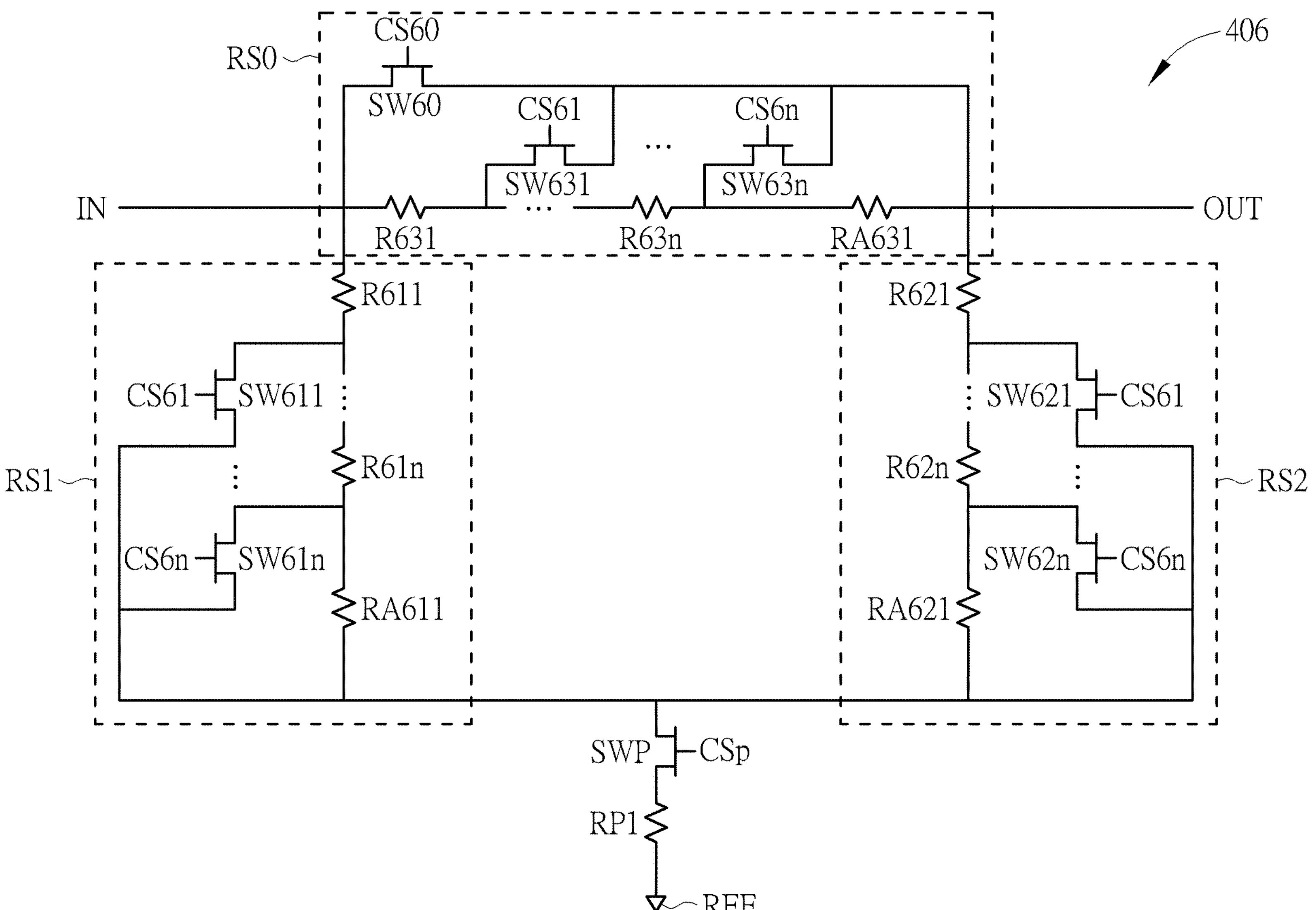
FIG. 8 is another circuit diagram of the attenuator circuit in the gain-adjustable amplifier circuit of FIG. 1, 2 or 3.

Please refer to FIG. 8. FIG. 8 is another circuit diagram of the attenuator circuit 40 of the gain-adjustable amplifier circuit 1, 2 or 3 of the embodiment of the present invention. The attenuator circuit 406 of FIG. 8 may correspond to the attenuator circuit 40 of FIG. 1 or FIG. 3 or the attenuator circuit 50 of FIG. 2 or FIG. 3.

The major difference between the attenuator circuit 406 and the attenuator circuit 405 is that the attenuator circuit 406 may further include a resistor RP1. The resistor RP1 may be coupled between the switch SWP and the reference voltage terminal REF. The resistor RP1 can provide more flexibility to choosing the resistance of each π-type attenuator (e.g., the first to third π-type attenuators).

Figure 9:
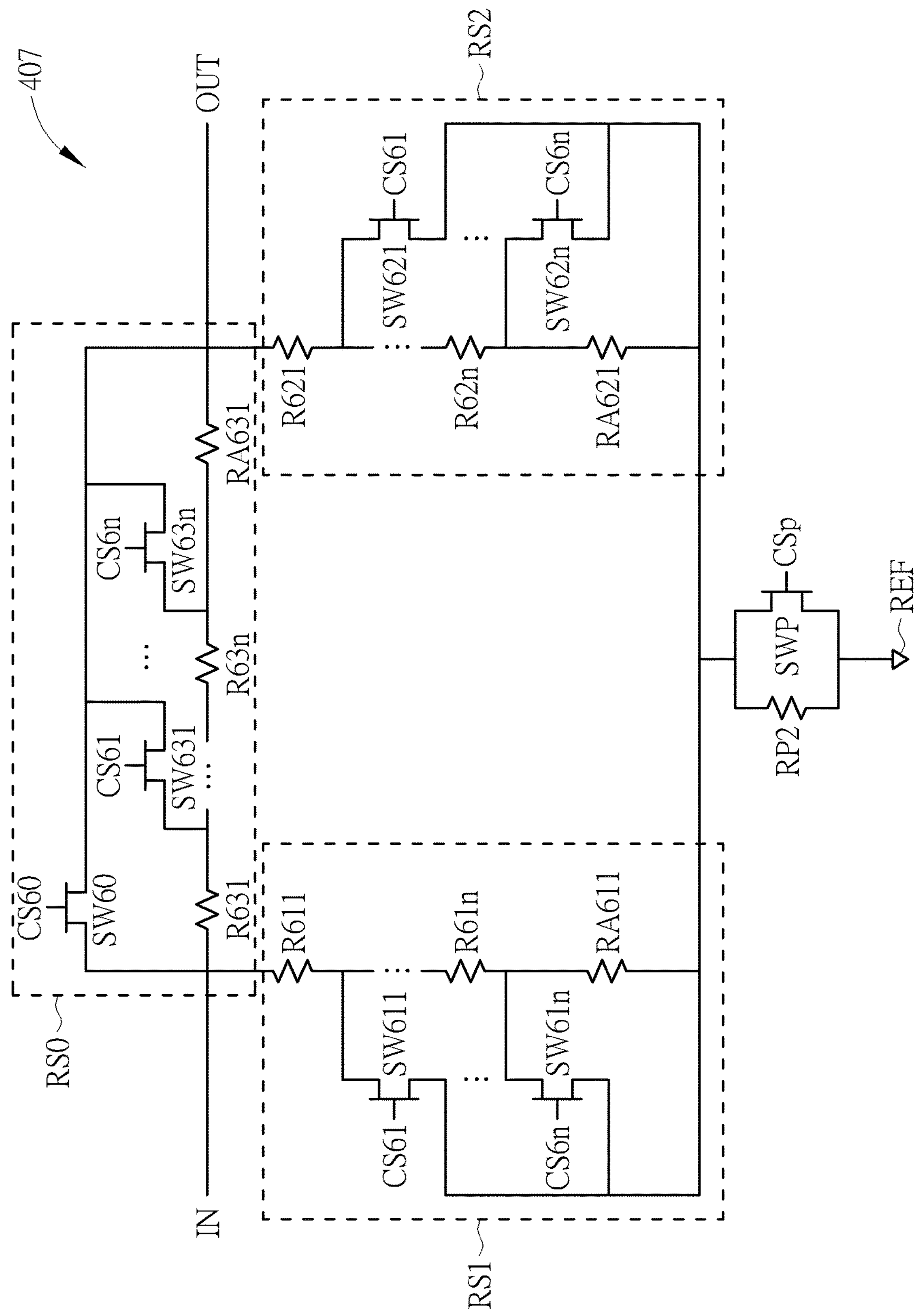
FIG. 9 is another circuit diagram of the attenuator circuit in the gain-adjustable amplifier circuit of FIG. 1, 2 or 3.

Please refer to FIG. 9. FIG. 9 is another circuit diagram of the attenuator circuit 40 of the gain-adjustable amplifier circuit 1, 2 or 3 of the embodiment of the present invention. The attenuator circuit 407 of FIG. 9 may correspond to the attenuator circuit 40 of FIG. 1 or FIG. 3, or the attenuator circuit 50 of FIG. 2 or FIG. 3.

The major difference between the attenuator circuit 407 and the attenuator circuit 405 is that the attenuator circuit 407 may further include a resistor RP2 coupled in parallel to the switch SWP. The resistor RP2 can provide more flexibility to choosing the resistance of each π-type attenuator (e.g., the first to third π-type attenuators).

In addition, the attenuator circuit 50 shown in FIG. 2 or 3 may be implemented by any one of the attenuator circuits in FIGS. 4 to 9. The implementation detail is not repeated here for brevity.

In the above embodiments, the switches and the transistors mentioned may be field effect transistors (FET) or other types of transistors. When the switches and the transistors are FETs, the first terminal may be either the drain or the source; the second terminal may be the other one of the drain and the source; the control terminal may be the gate.

The gain-adjustable amplifier circuit provided by the various embodiments of the present invention can expand the gain range of the amplifier circuit and adjust the gain of the amplifier circuit through the attenuator circuits. Moreover, since the attenuator circuit can have substantially symmetrical circuit structure, the attenuator circuit would not easily affect the output impedance matching of the amplifier in the amplifier circuit. In addition, by sharing at least one resistor in different π-type attenuators, occupied areas of the attenuator circuit are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:

an amplifier configured to generate an amplified input signal according to an input signal; and an attenuator circuit coupled to the amplifier, comprising:

an input terminal for receiving the input signal or the amplified input signal;

an output terminal;

a reference voltage terminal;

a zeroth resistor-switch circuit comprising:

a first terminal;

a second terminal, wherein the first terminal is coupled to the input terminal, and the second terminal is coupled to the output terminal; or the first terminal is coupled to the output terminal and the second terminal is coupled to the input terminal;

a zeroth switch coupled between the first terminal of the zeroth resistor-switch circuit and the second terminal of the zeroth resistor-switch circuit;

a zeroth resistor coupled between the first terminal of the zeroth resistor-switch circuit and the second terminal of the zeroth resistor-switch circuit;

a first resistor coupled between the zeroth resistor and the second terminal of the zeroth resistor-switch circuit; and a first switch comprising:

a first terminal coupled to the zeroth resistor and the first resistor;

a second terminal coupled to the second terminal of the zeroth resistor-switch circuit; and a control terminal;

a first resistor-switch circuit comprising:

a first terminal;

a second terminal, wherein the first terminal is coupled to the input terminal, and the second terminal is coupled to the reference voltage terminal; or the first terminal is coupled to the reference voltage terminal, and the second terminal is coupled to the input terminal;

a zeroth resistor coupled between the first terminal of the first resistor-switch circuit and the second terminal of the first resistor-switch circuit;

a first resistor coupled between the zeroth resistor and the second terminal of the first resistor-switch circuit; and a first switch comprising:

a first terminal coupled to the zeroth resistor and the first resistor;

a second terminal coupled to the second terminal of the first resistor-switch circuit; and a control terminal; and a second resistor-switch circuit comprising:

a first terminal;

a second terminal, wherein the first terminal is coupled to the output terminal, and the second terminal is coupled to the reference voltage terminal; or the first terminal is coupled to the reference voltage terminal, and the second terminal is coupled to the output terminal;

a zeroth resistor coupled between the first terminal of the second resistor-switch circuit and the second terminal of the second resistor-switch circuit;

a first resistor coupled between the zeroth resistor and the second terminal of the second resistor-switch circuit; and a first switch comprising:

a first terminal coupled to the zeroth resistor and the first resistor;

a second terminal coupled to the second terminal of the second resistor-switch circuit; and a control terminal.

2. The amplifier circuit of claim 1, wherein in a first mode, the attenuator circuit has a first attenuation and is configured to turn on the zeroth switch of the zeroth resistor-switch circuit and turn off the first switch of the zeroth resistor-switch circuit, the first switch of the first resistor-switch circuit and the first switch of the second resistor-switch circuit.

3. The amplifier circuit of claim 2, wherein in a second mode, the attenuator circuit has a second attenuation and is configured to turn off the zeroth switch of the zeroth resistor-switch circuit and turn on the first switch of the zeroth resistor-switch circuit, the first switch of the first resistor-switch circuit and the first switch of the second resistor-switch circuit.

4. The amplifier circuit of claim 3, wherein in a third mode, the attenuator circuit has a third attenuation and is configured to turn off the zeroth switch of the zeroth resistor-switch circuit and turn off the first switch of the zeroth resistor-switch circuit, the first switch of the first resistor-switch circuit and the first switch of the second resistor-switch circuit.

5. The amplifier circuit of claim 4, wherein the third attenuation is greater than the second attenuation, and the second attenuation is greater than the first attenuation.

6. The amplifier circuit of claim 1, wherein a difference between an impedance at the input terminal of the attenuator circuit and an impedance at the output terminal of the attenuator circuit is within ±10%.

7. The amplifier circuit of claim 1, wherein:

the zeroth resistor-switch circuit further comprising:

a second resistor coupled between the first resistor and the second terminal of the zeroth resistor-switch circuit; and a second switch comprising:

a first terminal coupled to the first resistor and the second resistor;

a second terminal coupled to the second terminal of the zeroth resistor-switch circuit; and a control terminal;

the first resistor-switch circuit further comprising:

a second resistor coupled between the first resistor and the second terminal of the first resistor-switch circuit; and a second switch comprising:

a first terminal coupled to the first resistor and the second resistor;

a second terminal coupled to the second terminal of the first resistor-switch circuit; and a control terminal; and the second resistor-switch circuit further comprising:

a second resistor coupled between the first resistor and the second terminal of the second resistor-switch circuit; and a second switch comprising:

a first terminal coupled to the first resistor and the second resistor;

a second terminal coupled to the second terminal of the second resistor-switch circuit; and a control terminal.

8. The amplifier circuit of claim 7, wherein in a first mode, the attenuator circuit has a first attenuation and is configured to turn on the zeroth switch of the zeroth resistor-switch circuit, and turn off the first switch of the zeroth resistor-switch circuit, the first switch of the first resistor-switch circuit and the first switch of the second resistor-switch circuit, and turn off the second switch of the zeroth resistor-switch circuit, the second switch of the first resistor-switch circuit and the second switch of the second resistor-switch circuit.

9. The amplifier circuit of claim 8, wherein in a second mode, the attenuator circuit has a second attenuation and is configured to turn off the zeroth switch of the zeroth resistor-switch circuit, and turn on the first switch of the zeroth resistor-switch circuit, the first switch of the first resistor-switch circuit and the first switch of the second resistor-switch circuit, and turn off the second switch of the zeroth resistor-switch circuit, the second switch of the first resistor-switch circuit and the second switch of the second resistor-switch circuit.

10. The amplifier circuit of claim 9, wherein in a third mode, the attenuator circuit has a third attenuation and is configured to turn off the zeroth switch of the zeroth resistor-switch circuit, and turn off the first switch of the zeroth resistor-switch circuit, the first switch of the first resistor-switch circuit and the first switch of the second resistor-switch circuit, and turn on the second switch of the zeroth resistor-switch circuit, the second switch of the first resistor-switch circuit and the second switch of the second resistor-switch circuit.

11. The amplifier circuit of claim 10, wherein in a fourth mode, the attenuator circuit has a fourth attenuation and is configured to turn off the zeroth switch of the zeroth resistor-switch circuit, and turn off the first switch of the zeroth resistor-switch circuit, the first switch of the first resistor-switch circuit and the first switch of the second resistor-switch circuit, and turn off the second switch of the zeroth resistor-switch circuit, the second switch of the first resistor-switch circuit and the second switch of the second resistor-switch circuit.

12. The amplifier circuit of claim 11, wherein:

the fourth attenuation is greater than the third attenuation;

the third attenuation is greater than the second attenuation; and the second attenuation is greater than the first attenuation.

13. The amplifier circuit of claim 7 further comprising a reference switch coupled between the first resistor-switch circuit, the second resistor-switch circuit and the reference voltage terminal.

14. The amplifier circuit of claim 13 further comprising a reference resistor coupled in series with the reference switch.

15. The amplifier circuit of claim 13 further comprising a reference resistor coupled in parallel with the reference switch.

16. The amplifier circuit of claim 7, wherein a difference between an impedance at the input terminal of the attenuator circuit and an impedance at the output terminal of the attenuator circuit is within ±10%.

17. The amplifier circuit of claim 1, wherein:

the first terminal of the zeroth resistor-switch circuit is coupled the input terminal;

the second terminal of the zeroth resistor-switch circuit is coupled to the output terminal;

the first terminal of the first resistor-switch circuit is coupled to the input terminal;

a second terminal of the first resistor-switch circuit is coupled to the reference voltage terminal;

the first terminal of the second resistor-switch circuit is coupled to the input terminal; and a second terminal of the second resistor-switch circuit is coupled to the reference voltage terminal.

18. The amplifier circuit of claim 1 further comprising a reference switch coupled between the first resistor-switch circuit, the second resistor-switch circuit and the reference voltage terminal.

19. The amplifier circuit of claim 18 further comprising a reference resistor coupled in series with the reference switch.

20. The amplifier circuit of claim 18 further comprising a reference resistor coupled in parallel with the reference switch.

* * * * *